United States Patent
Heid

(10) Patent No.: US 6,448,774 B1
(45) Date of Patent: Sep. 10, 2002

(54) GRADIENT COIL SYSTEM FOR A MAGNETIC RESONANCE TOMOGRAPHY APPARATUS FOR PRODUCING GRADIENT FIELDS WITH OBLIQUELY ORIENTED GRADIENTS

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/651,577

(22) Filed: Aug. 29, 2000

(30) Foreign Application Priority Data

Sep. 10, 1999 (DE) ......................................... 199 43 372

(51) Int. Cl.$^7$ ................................................. G01V 3/00
(52) U.S. Cl. ...................... 324/318; 324/320; 324/322; 324/307; 324/309
(58) Field of Search ................................. 324/318, 320, 324/322, 307, 309

(56) References Cited

U.S. PATENT DOCUMENTS

| | | | | |
|---|---|---|---|---|
| 4,647,858 A | * | 3/1987 | Bottomley | .................. 324/320 |
| 4,743,851 A | * | 5/1988 | Lim et al. | .................... 324/309 |
| 4,767,991 A | * | 8/1988 | Rzedzian | .................... 324/312 |
| 4,820,988 A | | 4/1989 | Crooks et al. | |
| 5,177,441 A | | 1/1993 | Morich et al. | |
| 5,278,504 A | * | 1/1994 | Patrick et al. | .............. 324/318 |
| 5,309,107 A | | 5/1994 | Pausch | |
| 5,530,355 A | * | 6/1996 | Doty | .......................... 324/318 |
| 5,759,152 A | * | 6/1998 | Felmlee et al. | ............. 600/410 |
| 5,939,882 A | | 8/1999 | Gebhardt et al. | |

FOREIGN PATENT DOCUMENTS

DE   OS 42 25 592    2/1994

* cited by examiner

Primary Examiner—Edward Lefkowitz
Assistant Examiner—Dixomora Vargas
(74) Attorney, Agent, or Firm—Schiff Hardin & Waite

(57) ABSTRACT

A gradient coil system of a magnetic resonance tomography apparatus is fashioned as a hollow cylinder whose hollow interior cross-section is an ellipse with a minor ellipse axis and a major ellipse axis, and contains first and second transverse gradient coils. A first gradient field having a first gradient can be generated with the gradient coil in an imaging volume, and a second gradient field having a second gradient can be generated in said imaging volume with the second gradient coil. The gradient coils are arranged so that the first and the second gradients exhibit an oblique position relative to the major and the minor ellipse axes.

10 Claims, 2 Drawing Sheets

GRADIENT COIL SYSTEM FOR A MAGNETIC RESONANCE TOMOGRAPHY APPARATUS FOR PRODUCING GRADIENT FIELDS WITH OBLIQUELY ORIENTED GRADIENTS

BACKGROUND OF THE INVENTION

1. Field of the Invention

The present invention is directed to a gradient coil system of the type that is fashioned as a hollow cylinder (tube), with the interior cross-section being elliptical.

2. Description of the Prior Art

Magnetic resonance tomography is a known technology for acquiring images of the inside an object, particularly, the body of a living examination subject. To this end, a magnetic resonance tomography apparatus contains a basic field magnet system and a gradient coil system. The basic field magnet system has, for example, a cylindrical hollow opening. The gradient coil system, which, for example, is fashioned in a tubular manner is arranged in this opening. An imaging volume is situated within the hollow opening of the gradient coil system. The basic field magnet system generates an optimally uniform, static basic magnetic field at least within the imaging volume. The basic magnetic field is co-linear with the principal cylinder axis, to which the z-axis of a Cartesian coordinate system is usually allocated. At least within the imaging volume, the gradient coil system superimposes rapidly switched magnetic fields with approximately constant gradients, referred to as gradient fields, on the basic magnetic field. Three gradient fields corresponding to the three spatial directions of the Cartesian coordinate system can be generated. At any arbitrary point in time, the gradient of the gradient field of a specific spatial direction is of approximately the same size independently of its location within the imaging volume. Since the gradient fields are time-variable magnetic fields, the above in fact applies to every point in time, but the magnitude of the gradient is variable from one point in time to another point in time. The direction of the gradient is usually permanently prescribed by the gradient coil design and is co-linear with one of the spatial directions of the Cartesian coordinate system.

For generating the gradient field, corresponding currents are generated in the gradient coil. The amplitudes of the required currents amount to several 100 A. Since the gradient switching times should be as short as possible, the current rise and decay rates amount to several 100 kA/s. For power supply, the gradient coil is connected to a gradient amplifier. Since the gradient coil represents an inductive load, correspondingly high output voltages of the gradient amplifier are required for generating the aforementioned currents.

In many magnetic resonance apparatuses, the hollow opening of the basic field magnet system is circular-cylindrical, and the gradient coil system is fashioned correspondingly circular-cylindrical. The diameter of the opening of the basic field magnet system is a cost-relevant quantity, particularly given super-conducting basic field magnet systems. The basic field magnet system becomes more expensive the larger the diameter must be fashioned in order to accommodate the gradient coil system therein.

U.S. Pat. No. 5,177,441 discloses a tubular gradient coil system with an elliptical cross-section. Compared to a comparable circular-cylindrical gradient coil system, lower inductances can, among other things, be achieved given comparable gradient field properties. As a result, faster switching speeds for the gradient fields and/or gradient amplifiers with lower power can be realized. High switching speeds are thereby important, particularly for sequences referred to as fast pulse sequences, and a gradient amplifier having lower power saves costs.

A disadvantage of the gradient coil system disclosed in U.S. Pat. No. 5,177,441 is that the two transverse gradient coils for generating gradient fields co-linearly with the minor and major ellipse axes differ greatly in terms of their geometry and their technical data. As a result, the two gradient coils particularly exhibit different inductances as well as different ohmic resistances. In order to achieve comparable switching speeds for the two gradient coils, their gradient amplifiers therefore must be designed with different powers and are differently loaded during operation. In the gradient coil systems with an elliptical cross-section according to the aforementioned patent, further, one of the transverse gradient coils is arranged closer on average to the circular-cylinder cladding of the hollow opening of the basic field magnet system than the other. As a result thereof, the disturbing effects produced in the basis field magnet system by the gradient coils via eddy current induction differ for the two gradient coils. Given employment of an active shielding for reducing these disturbing effects (artifacts), the active shielding must be differently designed for the two gradient coils in order to achieve a comparable shielding effect, which is difficult. A different shielding effect must be accepted given a comparably fashioned shielding.

SUMMARY OF THE INVENTION

It is an object of the present invention to provide a gradient coil system of the type initially described that alleviates the aforementioned disadvantages of the above-described conventional systems.

This object is inventively achieved in that an elliptical gradient coil system wherein the gradient coils are arranged such that a first gradient and a second gradient have an oblique position relative to the major and the minor ellipse axes. These two transverse gradient coils generate gradient fields whose gradients are not co-linear with one of the ellipse axes, as in conventional systems. More freedom is thus available in the arrangement of the gradient coils within the gradient coil system to match the two gradient coils to one another in terms of their geometrical configuration and their technical data. A "transverse gradient coil" means a gradient coil whose gradient is orthogonal relative to the direction of the basic magnetic field, at least in the imaging volume.

In an embodiment, the first and the second gradient exhibit an identical angle of inclination relative to the minor ellipse axis.

In another advantageous development, the gradient coils are arranged and designed such that the maximally producible first gradient and the maximally producible second gradient are the same in terms of magnitude. Particularly in combination with the immediately preceding embodiment, this allows the two gradient coils to be implemented approximately the same in terms of their geometrical design and their technical data.

In another embodiment, the gradient coils are arranged such that the first and the second gradients exhibit an angle of inclination in a range from approximately 45° through 80° relative to the minor ellipse axis. Particularly in combination with the aforementioned embodiments, this allows a gradient resulting from the first and second gradients to assume a lower maximum value (in terms of magnitude) in the direction of the minor ellipse axis than the resulting gradient in the direction of the major ellipse axis. This advantageously allows a direction-dependent stimulation sensitivity of a patient to be taken into account. This is true given the condition that the patient, whose body approximately corresponds to a cylinder having an elliptical cross-section, is disposed as concentrically as possible in the hollow opening of the gradient coil system. It is thereby known with respect to the direction-dependent stimulation sensitivity that gradient fields that frontally penetrate the patient, particularly in the sagittal direction, are especially prone to produce, which are an unwanted side effect produced by the gradient fields. German OS 42 52 592 is referenced for a detailed explanation of such direction-dependent stimulation sensitivity.

In a further embodiment, the gradient coils are arranged and designed such that the first and the second gradient coils have an identical inductance. As a result, identical switching speeds can be achieved for both gradient coils, with gradient amplifiers having the same power being advantageously utilized for both gradient coils. Further, it is implicit in the aforementioned arrangement and design of the gradient coils that these advantageously have approximately the same Ohmic resistances and that their dissipated power is thus the same.

In another embodiment, the first and second gradient coils are arranged and fashioned essentially symmetrically to one another relative to a first plane defined by the minor ellipse axis and the principal axis of the hollow opening, as well as relative to a second plane defined by the major ellipse axis and the principal axis of the hollow opening.

In another embodiment, a shielding coil for at least one of the gradient coils is arranged around the gradient coils with a circular-cylindrical shape. Due to this fashioning of the shielding coil, a high shielding effect can be achieved, especially in the region of the apex of the minor ellipse axis, as a result of the large distance between the gradient coil and the shielding coil. Moreover, the same shielding effect is achieved for both gradient coils given gradient coils arranged symmetrically relative to one another and a shielding of both gradient coils with shielding coils described above.

In a further embodiment, a first circuit includes the first gradient coil and a second circuit includes the second gradient coil, and the first and second circuits are connected to one another via a transformer whose mutual inductance, with operational sign inversion, is the same as a mutual inductance between the first and second gradient coils. As a result, a magnetic coupling of the two gradient coils dependent on the design of the gradient coils is compensated and a reactance of the two gradient amplifiers that is unfavorable for control reasons thereby is prevented.

In another embodiment, a coupling factor of the transformer is optimally equal to one. As a result, a increase in the load inductance for the two gradient amplifiers due to the transformer is kept optimally slight, and the maximally possible switching speeds of the gradient fields are not lowered.

In another embodiment, the gradient coils are free of conductor segments in the region of the apex of the major ellipse axis. This allows a smaller outside diameter of the gradient coil system to be achieved compared to a comparable hollow circular-cylindrical gradient coil system with comparable gradient field properties. The hollow opening of the basic field magnet system can, accordingly, be implemented smaller and the basic field magnet system is thus smaller and less expensive.

DESCRIPTION OF THE PREFERRED EMBODIMENTS

Figure 1:
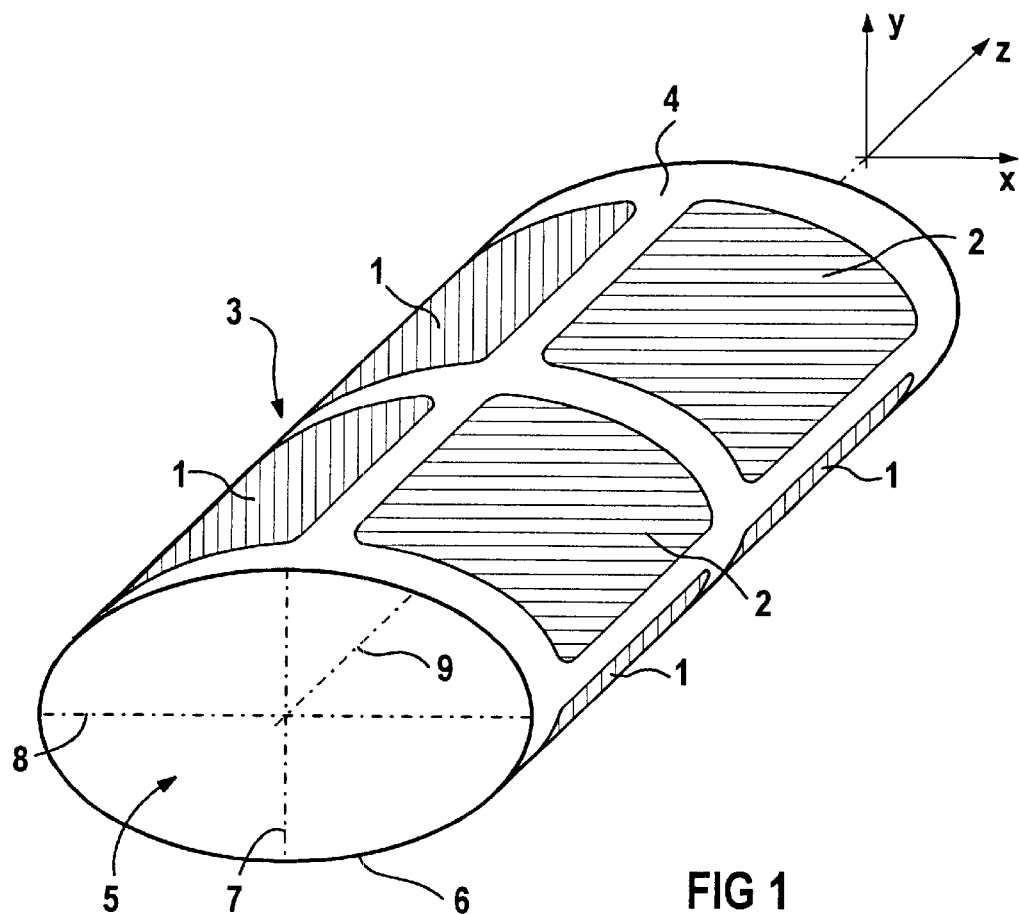
FIG. 1 is a perspective view of a hollow-cylindrical gradient coil system with elliptical inside cross-section in accordance with the invention.

As one embodiment of the invention, FIG. 1 shows a perspective view of a hollow-cylindrical gradient coil system 3 of a magnetic resonance tomography apparatus having an elliptical inside cross-section. For clarity, only an inner cylinder cladding 4 of a hollow opening 5 of the hollow-cylindrical gradient coil system 3 is shown. Other components of the magnetic resonance tomography apparatus such as a basic field magnet system and a radio-frequency system are likewise not shown. Those regions above which conductor segments of a first transverse gradient coil 1 and conductor segments of a second transverse gradient coil 2 extend in the gradient coil system 3 are identified by hatching on the inner cylinder cladding 4. Each of the two transverse gradient coils 1 and 2 contains four saddle-shaped coils. In practice, the exact arrangement of all conductor segments of a gradient coil is determined in an optimization method proceeding from a desired gradient field, for example, in German OS 42 03 582. This arrangements of the gradient coils 1 and 2 other than as shown can be used. For example, an overlap of the conductor segments of the two transverse gradient coils 1 and 2 can occur.

The cross-section of the inner cylinder cladding 4 essentially forms an ellipse 6 that is unambiguously mathematically-described by a minor ellipse axis 7 as well as a major ellipse axis 8. A principal hollow-cylinder axis 9 coincides with the z-axis of a Cartesian coordinate system. Further, the major ellipse axis 8 defines the x-axis, and the minor ellipse axis 7 defines the y-axis of the Cartesian coordinate system.

Figure 2:
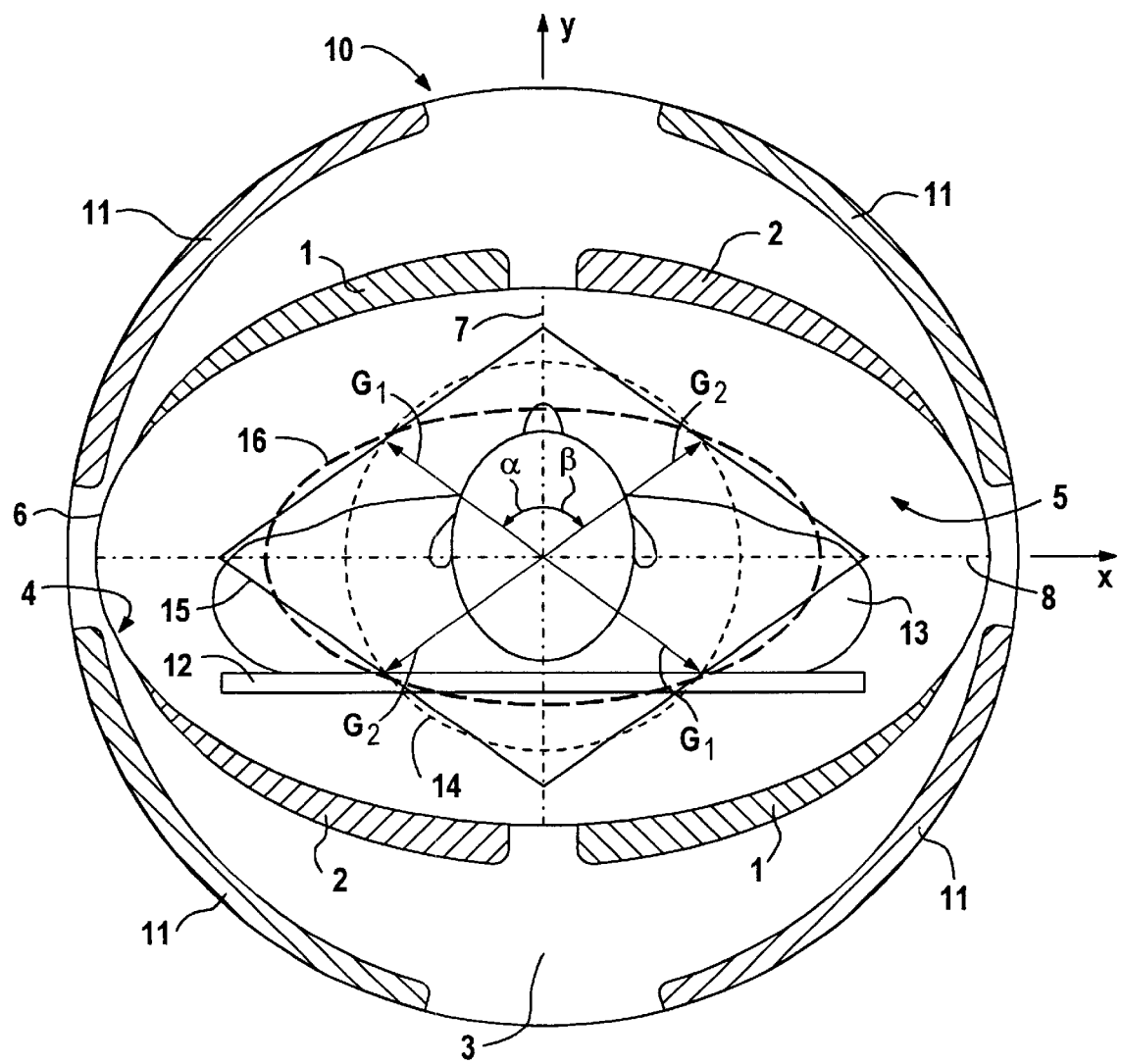
FIG. 2 is a cross-section through the hollow-cylindrical gradient coil system of FIG. 1.

FIG. 2 shows a cross-section through the hollow-cylindrical gradient coil system 3 with an elliptical interior cross-section from FIG. 1. Further elements, which are explained below, are shown compared to FIG. 1. The hollow-cylindrical gradient coil system 3 with elliptical inside cross-section has a circular outside cross-section and thus has an outer circular-cylinder envelope 10. A shielding coil 11 for active shielding of the gradient coils 1 and 2 is arranged along the circular-cylinder envelope 10 in the gradient coil system 3. A patient 13 lying on a patient bed 12 is shown in the hollow opening 5 of the gradient coil system 3. An imaging volume 14 (shown for exemplary purpose as spherical) of the magnetic resonance tomography apparatus is indicated with a broken-line circle. At least within the imaging volume 14, respective gradient fields with a gradient $G_1$ and a gradient $G_2$ can be generated by the two transverse gradient coils 1 and 2.

Each gradient $G_1$ and $G_2$ is shown in FIG. 2 with two arrows of equal length but opposite direction. The two directions of the arrows thereby indicate the possible directions of the gradients $G_1$ and $G_2$. The length of the arrows thereby represents the maximum magnitude of the gradients $G_1$ and $G_2$. The direction of the gradient $G_1$ or $G_2$ is determined by the direction of the current flow in the gradient coil 1 or 2, and the magnitude of the gradient $G_1$ or $G_2$ is determined by the amplitude of the current. The general alignment of the gradients $G_1$ and $G_2$ is determined by the structural implementation of the gradient coils 1 and 2. In the illustrated example, the maximum magnitude of the gradients $G_1$ and $G_2$ is the same. The gradients $G_1$ and $G_2$ are inclined by respective angles of inclination α and β relative to the minor ellipse axis 7. In the illustrated example of FIG. 2, both angles of inclination α and β are equal to 55°.

A resulting gradient derives from a vector addition of the two gradients $G_1$ and $G_2$. The maximum values of the resulting gradient thereby vary within limits represented by the parallelogram 15, whereby the resulting gradient assumes a lower maximum value in the y-direction than in the x-direction. This advantageously takes the direction-dependent stimulation sensitivity of the patient 13 into account. The direction-dependent stimulation limit of the patient 13 is indicated in FIG. 2 by an ellipse with a broken line. It is known that gradient fields that penetrate the patient 13, particularly in the y-direction, are especially prone to produce stimulations due to the high magnetic flux in the body of the patient 13. For avoiding stimulations, gradients in the y-direction therefor cannot assume values as high as gradients in the x-direction. The parallelogram 15 takes the aforementioned fact into consideration.

Figure 3:
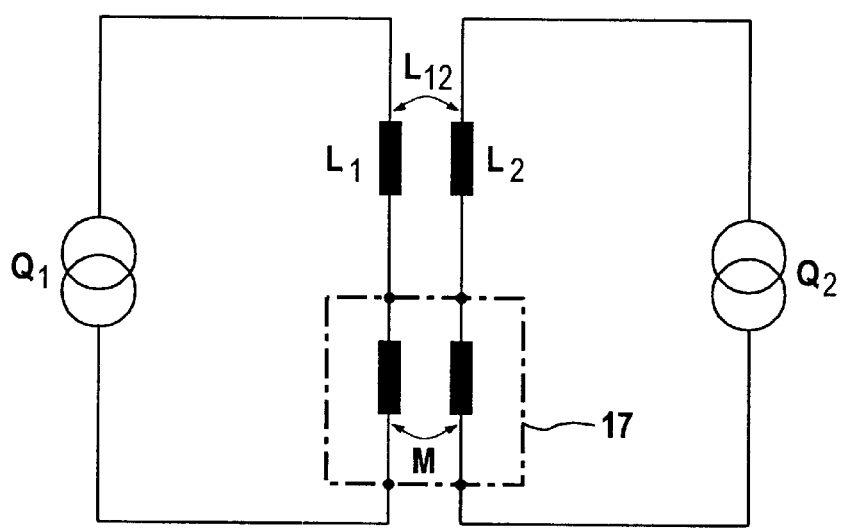
FIG. 3 is an equivalent circuit diagram of a circuit of the inventive gradient coil system, with a transformer.

FIG. 3 shows an equivalent circuit diagram of a power supply for the two transverse gradient coils 1 and 2. The gradient coils 1 and 2 are respectively represented as inductances $L_1$ and $L_2$ and are electrically supplied by respective gradient amplifiers $Q_1$ and $Q_2$. Due to the symmetrical design of the two gradient coils 1 and 2 shown in FIGS. 1 and 2 relative to one another, their inductances $L_1$ and $L_2$ are the same. A mutual inductance $L_{12}$ arises between the two transverse gradient coils 1 and 2 in the majority of embodiments. This magnetic coupling of the gradient coils 1 and 2 would result in reactances of the gradient amplifiers $Q_1$ and $Q_2$ being "seen by" one another that would be unfavorable for control reasons. In order to avoid these reactances, a transformer 17 is employed, for example in an embodiment as a decoupling transformer. To this end, the transformer 17 has a mutual inductance M that, with operational sign inversion, is the same as the mutual inductance $L_{12}$, i.e. $M=-L_{12}$. The transformer 17 has a coupling factor close to one so that an increase in the load inductance for the two gradient amplifiers $Q_1$ and $Q_2$ due to the transformer 17 is kept as low as possible and the maximally possible switching speeds of the gradient fields are not lowered.

Although modifications and changes may be suggested by those skilled in the art, it is the intention of the inventor to embody within the patent warranted hereon all changes and modifications as reasonably and properly come within the scope of his contribution to the art.

I claim as my invention:

1. A gradient coil system for a magnetic resonance tomography apparatus, said gradient coil system comprising:

a first transverse gradient coil which generates a first gradient field having a first gradient in an imaging volume;

a second transverse gradient coil which generates a second gradient field having a second gradient in said image volume;

a carrier for said first transverse gradient coil and said second transverse gradient coil having a tubular open interior with an elliptical cross-section forming, in cross-section, an ellipse with a major axis and a minor axis; and said first transverse gradient coil and said second transverse gradient coil being positioned on said carrier to orient each of said first and second transverse gradients at an oblique position relative to said major axis and relative to said minor axis.

2. A gradient coil system as claimed in claim 1 wherein each of said first and second transverse gradient coils are respectively positioned on said carrier to orient said first and second transverse gradients at a same angle of inclination relative to said minor axis.

3. A gradient coil system as claimed in claim 1 wherein said first transverse gradient coil has a maximum first gradient associated therewith, and wherein said second transverse gradient coil has a maximum second gradient associated therewith, said maximum first gradient and said maximum second gradient being equal in magnitude.

4. A gradient coil system as claimed in claim 1 wherein said first transverse gradient coil and said second transverse gradient coil are positioned on said carrier at to respectively orient said first and second transverse gradients at respective angles of inclination relative to said minor axis in a range between 45° and 80°.

5. A gradient coil system as claimed in claim 1 wherein said first transverse gradient coil has a first inductance and wherein said second transverse gradient coil has a second inductance, and wherein said first and second inductances are equal.

6. A gradient coil system as claimed in claim 1 wherein said carrier has a principle carrier axis proceeding perpendicularly to said major axis and to said minor axis, said principle axis and said minor axis defining a first plane and said principle axis and said major axis defining a second plane, and wherein said first and second transverse gradient coils are disposed on said carrier substantially symmetrically relative to said first plane and relative to said second plane.

7. A gradient coil system as claimed in claim 1 further comprising a shielding coil for at least one of said first transverse gradient coil and said second transverse gradient coil, said shielding coil being disposed on a circular cylindrical surface proceeding around said first and second transverse gradient coils.

8. A gradient coil system as claimed in claim 1 wherein said first transverse gradient coil and said second transverse gradient coil have a mutual inductance therebetween, and wherein said gradient coil system comprises a first circuit containing said first transverse gradient coil and a second circuit containing said second transverse gradient coil, and a transformer connecting said first circuit and said second circuit, said transformer having a mutual inductance which is equal in magnitude and opposite in sign to said mutual inductance between said first and second transverse gradient coils.

9. A gradient coil system as claimed in claim 8 wherein said transformer has a coupling factor substantially equal to 1.

10. A gradient coil system as claimed in claim 1 wherein said major axis has an apex, and wherein said first transverse gradient coil is comprised of conductor segments and wherein said second transverse gradient coil is comprised of conductor segments, and wherein said first and second gradient coils are each free of said conductor segments in a region at said apex of said major axis.

* * * * *